(12) United States Patent
Kouvetakis et al.

(10) Patent No.: US 7,781,356 B2
(45) Date of Patent: Aug. 24, 2010

(54) EPITAXIAL GROWTH OF GROUP III NITRIDES ON SILICON SUBSTRATES VIA A REFLECTIVE LATTICE-MATCHED ZIRCONIUM DIBORIDE BUFFER LAYER

(75) Inventors: John Kouvetakis, Mesa, AZ (US); Ignatius S. T. Tsong, Tempe, AZ (US); John Tolle, Gilbert, AZ (US); Radek Roucka, Tempe, AZ (US)

(73) Assignee: Arizona Board of Regents, a Body Corporate, Tempe, AZ (US)

( * ) Notice: Subject to any disclaimer, the term of this patent is extended or adjusted under 35 U.S.C. 154(b) by 1101 days.

(21) Appl. No.: 10/545,484

(22) PCT Filed: Feb. 12, 2004

(86) PCT No.: PCT/US2004/004605
§ 371 (c)(1),
(2), (4) Date: Jun. 19, 2006

(87) PCT Pub. No.: WO2004/073045
PCT Pub. Date: Aug. 26, 2004

(65) Prior Publication Data
US 2006/0236923 A1    Oct. 26, 2006

Related U.S. Application Data

(60) Provisional application No. 60/447,152, filed on Feb. 12, 2003.

(51) Int. Cl.
*C04B 35/58* (2006.01)
*C30B 25/00* (2006.01)

(52) U.S. Cl. .................. 501/102; 420/121; 420/422; 252/62.9 PZ; 252/507; 252/520.2; 117/84; 117/88

(58) Field of Classification Search ................. 501/102; 420/121, 422; 252/62.9 PZ, 507, 520.2; 117/84, 88
See application file for complete search history.

(56) References Cited

U.S. PATENT DOCUMENTS 4,668,538 A    5/1987   Feichtner et al.
(Continued)

FOREIGN PATENT DOCUMENTS

EP    1538243    6/2005
WO   2004/073045   8/2004

OTHER PUBLICATIONS

Sung, Junghwan et al., Remote-plasma chemical vapor deposition of conformal ZrB2 films at low temperature: A promising diffusion barrier for ultralarge scale integrated electronics, Mar. 15, 2002, 3904-911, vol. 91, No. 6, American Institute of Physics, USA.
(Continued)

*Primary Examiner*—Robert M Kunemund
*Assistant Examiner*—Matthew J Song
(74) *Attorney, Agent, or Firm*—McDonnell Boehnen Hulbert & Berghoff LLP

(57) ABSTRACT

A semiconductor structure and fabrication method is provided for integrating wide bandgap nitrides with silicon. The structure includes a substrate, a single crystal buffer layer formed by epitaxy over the substrate and a group III nitride film formed by epitaxy over the buffer layer. The buffer layer is reflective and conductive. The buffer layer may comprise B an element selected from the group consisting of Zr, Hf, Al. For example, the buffer layer may comprise $ZrB_2$, $AlB_2$ or $HfB_2$. The buffer layer provides a lattice match with the group III nitride layer. The substrate can comprise silicon, silicon carbide (SiC), gallium arsenide (GaAs), sapphire or $Al_2O_3$. The group III nitride material includes GaN, AlN, InN, AlGaN, InGaN or AlInGaN and can form an active region. In a presently preferred embodiment, the buffer layer is $ZrB_2$ and the substrate is Si(111) or Si(100) and the group III nitride layer comprises GaN. The $ZrB_2$ buffer layer provides a reflective and conductive buffer layer that has a small lattice mismatch with GaN. The semiconductor structure can be used to fabricate active microelectronic devices, such as transistors including field effect transistors and bipolar transistors. The semiconductor structure also can be used to fabricate optoelectronic devices, such as laser diodes and light emitting diodes.

45 Claims, 7 Drawing Sheets

U.S. PATENT DOCUMENTS

| | | | | |
|---|---|---|---|---|
| 5,042,887 | A | * | 8/1991 | Yamada ........................ 359/360 |
| 5,364,607 | A | | 11/1994 | Tebbe et al. |
| 6,151,240 | A | * | 11/2000 | Suzuki ........................ 365/145 |
| 6,207,844 | B1 | | 3/2001 | Kouvetakis et al. |
| 6,617,060 | B2 | | 9/2003 | Weeks, Jr. et al. |
| 7,297,989 | B2 | | 11/2007 | Otani et al. |
| 2002/0038892 | A1 | | 4/2002 | Otani et al. |
| 2003/0039866 | A1 | | 2/2003 | Mitamura et al. |
| 2005/0139960 | A1 | | 6/2005 | Shibata et al. |
| 2006/0060131 | A1 | | 3/2006 | Atanackovic et al. |

OTHER PUBLICATIONS

Aspnes, D.E., et al., "Dielectric functions and optical parameters of Si, Ge, GaP, GaAs, GaSb, InP, InAs, and InSb from 1.5 to 6.0 eV", The American Physical Society, Physical Review B, vol. 27, No. 2, Jan. 15, 1983, pp. 985-1009.

Chirita, et al., "Elastic properties of nanocrystalline zirconium-silicon-boron thin films", Journal of Applied Physics, vol. 89, No. 8, Apr. 15, 2001, pp. 4349-4353.

Kinoshita, et al., "Zironium Diboride (0001) as an Electrically Conductive Lattice-Matched Substrate for Gallium Nitride", Jpn. J. Appl. Phys., vol. 40, 2001, pp. L1280-L1282.

Kato, et al., "Selective growth of wurzite GaN and Alx Ga1-xN on GaN/sapphire substrates by metalorganic vapor phase epitaxy", Journal of Crystal Growth, 144, 1994, pp. 133-140.

Lee, et al., "Growth of crack-free AlGaN film on high-temperature thin AlN interlayer", Journal of Crystal Growth, 234, 2002, pp. 305-310.

Linthicum, et al., "Pendeoepitaxy of gallium nitride thin films", Applied Physics Letters, vol. 75, No. 2, Jul. 12, 1999, pp. 196-198.

Liu, et al., "Atomic arrangement at the AlN/ZrB2 interface", Applied Physics Letters, vol. 81, No. 17, Oct. 21, 2002, pp. 3182-3184.

Molnar, et al., "Growth of gallium nitride by hydride vapor-phase epitaxy", Journal of Crystal Growth, 178, 1997, pp. 147-156.

Otani, et al., "Preparation of ZrB2 single crystals by the floating zone method", Journal of Crystal Growth, 165, 1996, pp. 319-322.

Porowski, S., "Bulk and homoepitaxial GaN-growth and characterization", Journal of Crystal Growth, 189, 1998, pp. 153-158.

Suda, et al., "Heteroepitaxial growth of group-III nitrides on lattice-matched metal boride ZrB2 (0001) by molecular beam epitaxy", Journal of Crystal Growth, 237-239, 2002, pp. 1114-1117.

Sung, et al., "Remote-plasma chemical vapor deposition of conformal ZrB2 films at low temperature: A promising diffusion barrier for ultralarge scale integrated eletronics", J. Appl. Phys., vol. 91, No. 6, Mar. 15, 2002, pp. 3904-3911.

Trampert, et al., "Direct observation of the initial nucleation and epitaxial growth of metastable cubic GaN on (001) GaAs", Applied Physics Letters, 70 (5), Feb. 3, 1997, pp. 583-585.

Maeda, et al. (2001) Phys. Stat. Sol. (a) 188(1): 223-226.

Makimoto, et al. (2001) Phys. Stats. Sol. (a) 188(1):183-186.

Kuramata, et al. (1998) J. Crystal Growth 189/190: 826-830.

Mukai, et al. (1998) J. Crystal Growth 189/190: 778-781.

Nakamura et al. (1998) J. Crystal Growth 189/190: 841-845.

Kamiyama et al., Phys. Stat. Sol. (a) 200 (1): 67-70 (2003).

Trivedi, Appl. Phys Lett., 2003, 87, 2398-2400.

Liu, Phys Rev B 2005, 72. 245335-1-245335-7.

Takamura, Phys Rev Lett 2005, 95, 266105-1-266105-4.

Roucka, J. Cryst. Growth 2005, 277, 364-371.

Kinoshita, Jpn. J. Appl. Phys., 2003, 42, 2260-2264.

\* cited by examiner

EPITAXIAL GROWTH OF GROUP III NITRIDES ON SILICON SUBSTRATES VIA A REFLECTIVE LATTICE-MATCHED ZIRCONIUM DIBORIDE BUFFER LAYER

RELATED APPLICATION DATA

This application is the U.S. national stage of PCT Application No. PCT/US04/04605 now titled "Epitaxial Growth of a Zirconium Diboride Layer on Silicon Substrates," which is based on and claims the priority and benefit of U.S. Provisional Patent Application No. 60/447,152 filed on Feb. 12, 2003, both of which are incorporated herein in their entirety by this reference.

STATEMENT OF GOVERNMENT FUNDING

The United States Government provided financial assistance for this project through the National Science Foundation under Grant Nos. DMR 0221993, DMR-0303237, ENG-0304362 and through U.S. Army Research Office Grant No. DAAD 19-00-1-0471. Thus, the United States Government may have certain rights to this invention.

BACKGROUND

This invention relates generally to semiconductor materials and structures. More particularly, it relates to a method for producing a semiconductor structure including an epitaxial reflective buffer layer, such as zirconium diboride ($ZrB_2$), formed over a substrate, such as a silicon substrate.

Group III nitride materials include gallium nitride (GaN), aluminum nitride (AlN), indium nitride (InN) and their alloys such as aluminum gallium nitride (AlGaN), indium gallium nitride (InGaN), and aluminum indium gallium nitride (AlInGaN). These materials are semiconductor compounds that have a wide direct bandgap, which permits highly energetic electronic transitions to occur. Such electronic transitions can result in group III nitride materials having a number of attractive properties including the ability to efficiently emit blue and ultraviolet light, the ability to transmit signals at high frequency, and others. Accordingly, group III nitride materials are being widely investigated in many semiconductor device applications, including microelectronic devices such as transistors, and optoelectronic devices such as laser diodes and light emitting diodes (LEDs).

Group III nitride materials have been formed on a number of different substrates including sapphire, silicon (Si), and silicon carbide (SiC). Semiconductor structures, such as doped regions, may then be formed within the group III nitride material region. There are many advantages of growing group III nitrides, such as GaN, on Si substrates, an important one of which is the integration with Si-based electronics and the availability of very large area substrates. Previously, however, semiconductor structures having group III nitrides formed on Si substrates have presented significant drawbacks. Such structures have been complicated and expensive to fabricate. Moreover, light emitting optoelectronic devices having group III nitrides formed on silicon substrates have less efficient than such devices formed on sapphire substrates. In optoelectronic applications, Si is approximately 45% absorbing in the ultraviolet (UV) region, while sapphire is totally transparent. See E. Aspnes and A. A. Studna, Phys. Rev. B 27, 985 (1983). Thus, a light-emitting optoelectronic device based on group III nitrides will be less efficient if Si(111) is used as a substrate than if sapphire is used as a substrate.

The growth of group III nitrides, including GaN, is most commonly accomplished by heteroepitaxy using methods of metalorganic chemical vapor deposition (MOCVD) and molecular beam epitaxy (MBE). The substrates employed are generally sapphire and α-SiC(0001), with have lattice mismatches of 16% and 3.6% respectively with GaN. Coupled with mismatches in thermal expansion coefficients, the misfit dislocations produced in GaN during heteroepitaxial growth pose a limitation to the ultimate performance of nitride-based electronics. Various growth schemes involving patterned substrates have been developed to improve the dislocation density. These growth schemes include, for example, epitaxy by lateral overgrowth (ELOG), which is described in Y. Kato, S. Kitamura, K. Hiramatsu and N. Sawaki, J. Cryst. Growth 144, 133 (1994) [1], and pendeoepitaxy (PE), which is described in K. Linthicum, T. Gehrke, D. Thomson, E. Carlson, P. Rajagopal, T. Smith, D. Batchelor and R. F. Davis, Appl. Phys. Lett. 75, 196 (1999) [2]. Nevertheless, the quest for lattice-matched substrates continues. Bulk GaN crystals grown under high pressures, as described by S. Porowski, J. Cryst. Growth 189/190, 153 (1998) [3], have been used as substrates. Such substrates, however, are hampered by their small size. Another approach to homoepitaxy is the growth of thick GaN layers by hydride vapor phase epitaxy (HVPE), which is described by R. J. Molnar, W. Götz, L. T. Romano and N. M. Johnson, J. Cryst. Growth 178, 147 (1997) [4]. These substrates, however, suffer from poor crystallinity and the highly strained layers often develop cracks and other undesirable morphologies.

Recently, H. Kinoshita, S. Otani, S. Kamiyama, H. Amano, I. Akasaki, J. Suda and H. Matsunami, Jpn. J. Appl. Phys., pt. 2, 40, L1280 (2001) [5] have reported the growth of single crystals of zirconium diboride, $ZrB_2(0001)$ to provide an electrically conductive lattice-matched substrate for GaN growth. $ZrB_2$ has a hexagonal structure with lattice constants a=3.169 Å and c=3.530 Å. The in-plane lattice constant has only 0.6% mismatch with that of GaN (a=3.189 Å). The thermal expansion coefficients along [10$\bar{1}$0] on the basal plane are also well-matched between $ZrB_2$ and GaN, being $5.9 \times 10^{-6}$ K$^{-1}$ and $5.6 \times 10^{-6}$ K$^{-1}$ respectively. While these similarities in thermal properties between $ZrB_2$ and GaN suggest that the use of $ZrB_2(0001)$ as a substrate for the growth of GaN films may lead to a reduction of both dislocation density and biaxial strain in the GaN, significant drawbacks still limit the use of $ZrB_2$ as a substrate for the growth of GaN films. One such drawback is the high temperature required to prepare single crystals of $ZrB_2$. Preparation of these crystals requires very high temperatures since the melting point of $ZrB_2$ is 3220° C. A float-zone method has been developed, as described by S. Otani and Y. Ishizawa, J. Cryst. Growth 165, 319 (1996) [6], in which a 1-cm diameter rod was isostatically pressed at 1700° C. from $ZrB_2$ powder and melted in a floating zone by radio frequency (RF) heating. The molten zone was ~0.5 cm long and a growth rate of 2-3 cm per hour was obtained, as described by S. Otani and Y. Ishizawa [6] and H. Kinoshita, S. Otani, S. Kamiyama, H. Amano, I. Akasaki, J. Suda and H. Matsunami [5]. The $ZrB_2$ single crystals thus grown, however, have size limitations. A typical size of such a crystal of Zr $B_2$ is 1 cm in diameter and 6 cm long. Successful epitaxial and strainfree GaN and AlN growth on such single crystals of $ZrB_2$ using MBE and MOCVD have been reported, respectively by J. Suda and H. Matsunami, J. Cryst. Growth 237-239, 1114 (2002) [7] and R. Liu, A. Bell, F. A. Ponce, S. Kamiyama, H. Amano and I. Akasaki, Appl. Phys. Lett. 81, 3182 (2002) [8]. However, the size limitation of the $ZrB_2$ substrate remains an unresolved issue.

It is an object of the present invention to provide semiconductor structures having group III nitride materials formed on substrates, which structures avoid the drawbacks discussed above, and to provide a method for fabricating such semiconductor structures relatively simply and inexpensively.

It is another object of the present invention to provide semiconductor structures having group III nitride materials formed on silicon substrates and a method for fabricating such structures relatively simply and inexpensively.

It is still another object of the present invention to provide semiconductor structures having group III nitride materials formed on substrates, which structures can be used for active semiconductor devices, such as transistors, field emitters, and optoelectronic devices.

It is yet another object of the present invention to provide a semiconductor structure having a group III nitride material formed on a silicon substrate and that can be used for an efficient light-emitting optoelectronic device.

It is still another object of the present invention to provide a semiconductor substrate structure including a silicon substrate wherein the substrate structure does not absorb visible and UV light.

Additional objects and advantages of the invention will be set forth in the description that follows, and in part will be apparent from the description, or may be learned by practice of the invention. The objects and advantages of the invention may be realized and obtained by means of the instrumentalities and combinations pointed out in the appended claims.

SUMMARY

To achieve the foregoing objects, and in accordance with the purposes of the invention as embodied and broadly described in this document, there is provided a semiconductor structure including a substrate, a single crystal buffer layer formed by epitaxy over the substrate and a group III nitride film formed by epitaxy over the buffer layer. The buffer layer is reflective and conductive. The buffer layer may comprise B an element selected from the group consisting of Zr, Hf, Al. For example, the buffer layer may comprise $ZrB_2$, $AlB_2$ or $HfB_2$. The buffer layer can provide a lattice match with an active layer formed over the buffer layer. The substrate may comprise a material selected from the group consisting of Si, $Al_2O_3$, SiC and GaAs. The substrate can comprise silicon, silicon carbide (SiC), gallium arsenide (GaAs), sapphire or $Al_2O_3$. In a presently preferred embodiment, the buffer layer is $ZrB_2$ and the substrate is Si(111) or Si(100).

A semiconductor structure according to the invention can integrate wide bandgap nitride semiconductors with silicon. In a preferred embodiment, the semiconductor structure includes: a silicon substrate; a $ZrB_2$ region formed over the substrate, and an active region formed over the $ZrB_2$ region. The active region can comprise a group III nitride material, such as GaN, AlN, InN, AlGaN, InGaN or AlInGaN, or a quaternary nitride such as SiCAlN. The active region can be formed by known fabrication processes, including metal organic chemical vapor deposition or by atomic layer epitaxy. The semiconductor structure can be used to fabricate active microelectronic devices, such as transistors including field effect transistors and bipolar transistors. The semiconductor structure also can be used to fabricate optoelectronic devices, such as laser diodes and light emitting diodes. The $ZrB_2$ buffer layer provides a reflective and conductive buffer layer that has a small lattice mismatch with GaN. The GaN films epitaxially grown on the buffer layer formed on Si(111) exhibit PL intensities comparable to MOCVD grown GaN films. Thus, efficient light-emitting optoelectronic devices based on group m nitrides can be produced.

Also according to the invention, there is provided a method for depositing an epitaxial metallic layer having the formula $XB_2$, where X is an element selected from the group consisting of Zr, Hf and Al, on a substrate in a gas source molecular beam epitaxy chamber. The method comprises introducing into the chamber a gaseous precursor including X under conditions whereby epitaxial $XB_2$ is formed on the substrate. Suitable substrates may include silicon (Si), silicon carbide (SiC), gallium arsenide (GaAs), sapphire or $Al_2O_3$. A presently preferred a method provides for depositing an epitaxial $ZrB_2$ layer on a Si(111) substrate using a single-source unimolecular precursor zirconium borohydride, $Zr(BH_4)_4$ in a gas source molecular beam epitaxy chamber. The method includes introducing into the chamber the gaseous precursor $Zr(BH_4)_4$ at a temperature of between 875° C. and 925° C., preferably about 900° C. The epitaxial $ZrB_2$ growth rate is about 1.2 nm per minute. Epitaxial growth of $ZrB_2(0001)$ is accomplished despite the very large lattice mismatch between $ZrB_2$ and Si(111). High resolution cross-sectional transmission electron microscopy images of the sharp $ZrB_2$/Si(111) interface show a heteroepitaxial relationship involving a "magic mismatch" of coincidence lattices. GaN films grown on the $ZrB_2$/Si(111) template show virtual homoepitaxy because of the very small lattice mismatch, 0.6%, between the in-plane lattice parameters of $ZrB_2(0001)$ and GaN(0001). The $ZrB_2$/Si(111) serves as an ideal template for growth of GaN epitaxial films. The area of the GaN films is limited only by the available size of the Si(111) substrates.

BRIEF DESCRIPTION OF THE DRAWINGS

The accompanying drawings, which are incorporated in and constitute a part of the specification, illustrate the presently preferred embodiments and methods of the invention. Together with the general description given above and the detailed description of the preferred embodiments and methods given below, they serve to explain the principles of the invention.

DESCRIPTION

Figure 1:
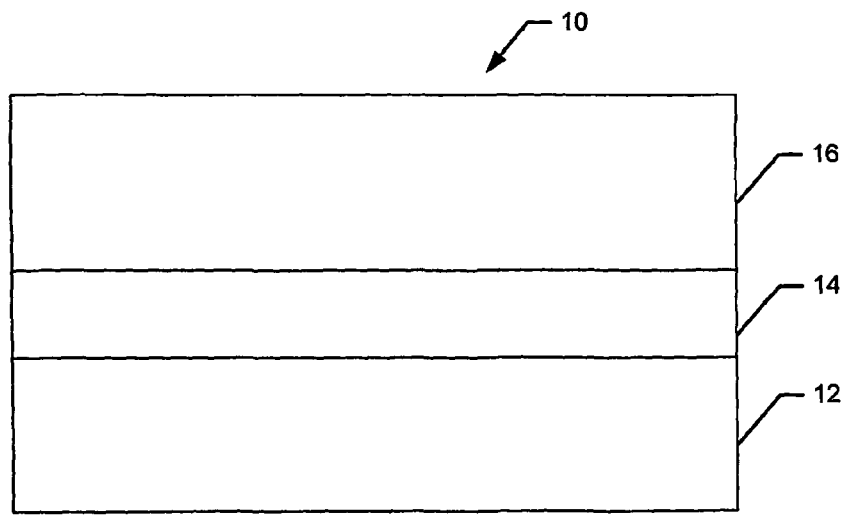
FIG. 1 illustrates a semiconductor structure according to the present invention, including a substrate, a reflective and conductive buffer layer formed over the substrate and a group m nitride film formed over the buffer layer.

Referring to FIG. 1, a semiconductor structure 10 according to one exemplary embodiment of the present invention is shown schematically. Semiconductor structure 10 includes a substrate 12 and single-crystalline reflective and conductive buffer layer 14 formed by epitaxy over the substrate. The buffer layer 14 provides a near lattice-matched template for the growth of an epitaxial group III nitride film 16 formed over the metal buffer layer 14, as described further below.

An "epitaxial" film generally refers to a film with the highest order of perfection in crystallinity, i.e. as in a single crystal. Because of their low defect density, epitaxial films are especially suitable for microelectronic and, more particularly, optoelectronic applications.

It should be understood that when a layer is referred to as being "on" or "over" another layer or substrate, it can be directly on the layer or substrate, or an intervening layer may also be present. It should also be understood that when a layer is referred to as being "on" or "over" another layer or substrate, it may cover the entire layer or substrate, or a portion of the layer or substrate.

The Reflective Buffer Layer and the Substrate

According to one set of embodiments, the reflective buffer layer 14 is composed of a diboride material having the formula XB$_2$, where X is an element selected from the group consisting of Zr, Hf and Al. In a presently preferred embodiment, the reflective buffer layer 14 is composed of ZrB$_2$. Reflective buffer layers composed of HfB$_2$ and AlB$_2$ may be suitable in some cases, but generally do not provide as close lattice match with the group III nitride layer 16 as does ZrB$_2$. Group III nitrides, preferably aluminum nitride, for example, may be grown on the XB$_2$ layered. XB$_2$ films formed on large area wafers comprising Si or SiC are especially suitable for substrates for growth of the Group III nitride layers.

Reflective buffer layer 14 can have a variety of thicknesses depending on the application. Generally, though not necessarily, reflective buffer layer 14 has a thickness of about 25 nm to about 100 nm. A typical ZrB$_2$ buffer layer with a thickness of 25 nm has a metallic appearance and is 100% reflecting in the visible to ultraviolet (UV) wavelength range.

Substrate 12 typically is formed of high-quality single-crystal silicon as is readily available in the art. Silicon substrates having different crystallographic orientations may be used. As used herein, "silicon substrate" refers to any substrate that includes a silicon layer at its top surface. Examples of suitable silicon substrates include substrates that are composed entirely of silicon (e.g., silicon wafers), silicon-on-insulator (SOI) substrates, silicon-on-sapphire substrate (SOS), SIMOX substrates, among others. In most cases, silicon (111) substrates are preferred. In other cases, substrates of other forms of silicon, such as Si(100), may be preferred. In still other cases, substrates of sapphire, silicon carbide (SiC) and gallium arsenide (GaAs) may be used.

Substrate, 12 may have any dimensions as used in the art. Suitable diameters for silicon substrates include, but are not limited to, 2 inches, 4 inches, 6 inches, 8 inches and 12 inches. In some embodiments, substrate 12 is relatively thick, for example, greater than 250 microns. Thicker substrates are generally able to resist bending which can occur, in some cases, in thinner substrates.

The Group III Nitride Layer

The group III nitride layer 16 can be formed of gallium nitride (GaN), aluminum nitride (AlN), indium nitride (InN) or any of their alloys including aluminum gallium nitride (AlGaN), indium gallium nitride (InGaN), and aluminum indium gallium nitride(AlInGaN). It should be understood that variations in the composition of the group III nitride layer 16 may occur, for example, as a purpose of design or as a result of slight non-uniformities and inhomogeneities during growth. Group III nitride material layer 16 preferably has a monocrystalline structure. The gallium nitride material layer 16 is generally of high enough quality so as to permit the formation of devices therein.

The thickness of the group III nitride layer 16 is dictated, in part, by the requirements of the specific application. In applications when the group III nitride material is used as a device layer, the thickness is sufficient to permit formation of the device. The group III nitride layer 16 generally has a thickness of greater than 0.1 micron, though not always. In other cases, thicker gallium nitride material layers are desired such as thicknesses greater than 0.5 micron, greater than 0.75 micron, greater than 1.0 microns, greater than 2.0 microns, or even greater than 5.0 microns.

Growth of the Reflective Buffer Layer

According to one preferred method, buffer layer 14 can be grown on substrate 12 using a molecular beam epitaxy (MBE) process. Generally, in the MBE process, molecular beams are directed at a heated substrate in an MBE chamber where reaction and epitaxial film growth occurs. The MBE process is more fully described in E. H. C. Parker (Ed.) "The Technology and Physics of Molecular Beam Epitaxy," Plenum Press (1985). By selecting the appropriate flux species in the MBE process, and by exercising precise control of the kinetic factors, i.e., flux rate, flux ratio, and substrate temperature, during growth, the morphology, composition and microstructure of films can be tailored on an atomic level.

Deposition of the reflective buffer layer 14 is achieved using gas-source molecular beam epitaxy (GSMBE) which comprises a flux of a gaseous precursor directed onto a substrate under conditions where the precursor reacts with the substrate to commence growth of epitaxial reflective thin film on the substrate. For growth of a reflective buffer layer having the formula $XB_2$, where X is an element selected from the group consisting of Zr, Hf and Al, the gaseous precursor includes X under conditions whereby epitaxial $XB_2$ is formed on the substrate. Typically, the gaseous precursor is connected via a high vacuum leak valve to the GSMBE chamber (which will be referred to as a MBE reaction chamber) containing a heated substrate. The gaseous precursor is allowed to flow into the reaction chamber, which is typically maintained at a base pressure of about $2\times10^{-10}$ Torr by an ultrahigh vacuum pumping system. When the precursor is delivered, the pressure in the chamber increases to about $5\times10^{-9}$ Torr.

The reflective buffer layer growth process is conducted in the MBE chamber with the substrate held at temperatures between about 875° C. and about 925° C., preferably at about 900° C., with the gaseous precursor consisting of a unimolecular gas-source precursor. The substrates are preferably silicon or silicon carbide wafers. In the method, the substrate, growth temperature, flux species and flux rate may be chosen to determine various features of the reflective film undergoing growth. The growth rate of the reflective buffer layer is deliberately limited to about 1.2 nm/min.

According to a presently preferred method, a $ZrB_2$ buffer layer is been grown on a Si(111) substrate using a single-source unimolecular precursor zirconium borohydride, $Zr(BH_4)_4$. The unimolecular precursor $Zr(BH_4)_4$ has a vapor pressure of ~8 Torr at room temperature and is therefore highly useful as a single gas source for MBE applications. The growth of $ZrB_2$ films on Si(111) substrates at 900° C. proceeds via the following reaction:

$$Zr(BH_4)_4(gas) \rightarrow ZrB_2(film) + B_2H_6(gas) + 5H_2(gas).$$

The base pressure in the MBE chamber is $\sim 2\times10^{-10}$ Torr. The Si(111) substrate surface is cleaned by flashing briefly to 100° C. prior to deposition. For $ZrB_2$ film growth, the gaseous $Zr(BH_4)_4$ precursor is admitted via a leak valve and delivered through a gas inlet tube positioned ~2 cm from the substrate surface, whereupon the pressure in the chamber increases to $\sim 5\times10^{-9}$ Torr. The growth rate of the $ZrB_2$ film is ~1.2 nm/min and is deliberately limited to such a slow rate. It has been found that higher fluxes of $Zr(BH_4)_4$ lead to very high growth rates and the resulting $ZrB_x$ films are invariably amorphous, similar to those reported previously by J. Sung, D. M. Goedde, G. S. Girolami and J. R. Abelson, J. Appl. Phys. 91, 3904 (2002) [9] and M. Chirita, H. Xia, R. Sooryakumar, J. B. Tolle, V. M. Torres, B. J. Wilkens, D. J. Smith, J. Kouvetakis and I. S. T. Tsong, J. Appl. Phys. 89, 4349 (2001) [10]. The fact that we obtained crystalline $ZrB_2$ films only under slow growth conditions at about 900° C. suggests that while the formation of $ZrB_2$ from $Zr(BH_4)_4$ is thermodynamically driven, the epitaxial growth of $ZrB_2$ films is controlled by kinetics.

Figure 2:
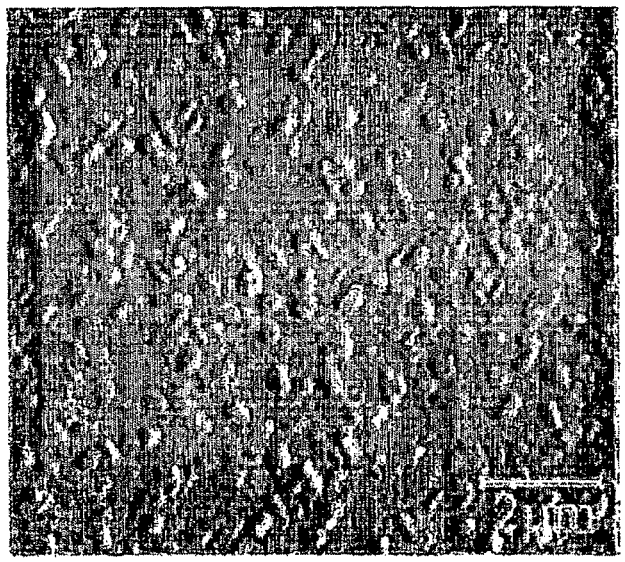
FIG. 2 is an atomic force microscope (AFM) image showing the surface morphology of a reflective and conductive layer comprising $ZrB_2(0001)$ grown over a Si(111) substrate according to the present invention.

Referring to FIG. 2, the surface morphology of a $ZrB_2$ film grown on a Si(111) substrate according to the present invention is shown in an atomic force microscopy (AFM) image. The RMS roughness is 1.4 nm. The $ZrB_2$ buffer layer on Si(111) provides a near lattice-matched template for the growth of an epitaxial group III nitride material.

While the growth of the $ZrB_2$ buffer layer using MBE has been described, it will be understood that other known processes for growing epitaxial films can be used. For example, the $ZrB_2$ layer also could be grown by chemical vapor deposition (CVD) using a heavily diluted zirconium borohydride gas source. The dilution agent can be hydrogen or any inert gas, such as helium, argon or nitrogen.

Also, although growth of the $ZrB_2$ layer on a Si(111) substrate has been described, the method described above can be used to grow the $ZrB_2$ layer on substrates of other forms of silicon, such as Si(100), and on substrates of sapphire, silicon carbide (SiC) and gallium arsenide (GaAs). Also, by growing a capping layer of SiCAlN, GaN, AlGaN or InGaN over the $ZrB_2$ layer, oxidation of the $ZrB_2$ layer can be prevented. Crystalline Si can be grown on the $ZrB_2$ layer to form structures in which the metallic $ZrB_2$ serves as a ground plane or a Schottky or ohmic contact.

Growth of Group III Nitride Layer

In an important aspect of the invention, the deposited reflective buffer layer is a substrate for growth of other compounds by methods generally employed in the industry for semiconductor fabrication. Following growth of the reflective buffer layer 14, the group III nitride layer 16 can be grown using suitable techniques known in the art to deposit the group III nitride material, including but not necessarily limited to MBE and metalorganic chemical vapor deposition (MOCVD).

Figure 3:
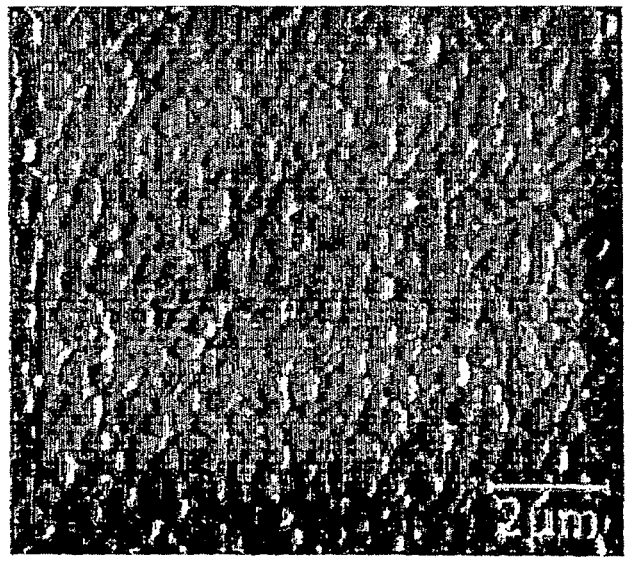
FIG. 3 is an AFM image showing the surface morphology of a group III nitride layer comprising a GaN(0001) film grown by plasma-assisted MBE on a reflective and conductive layer $ZrB_2(0001)$ layer formed on a silicon substrate according to the present invention.
Figure 5:
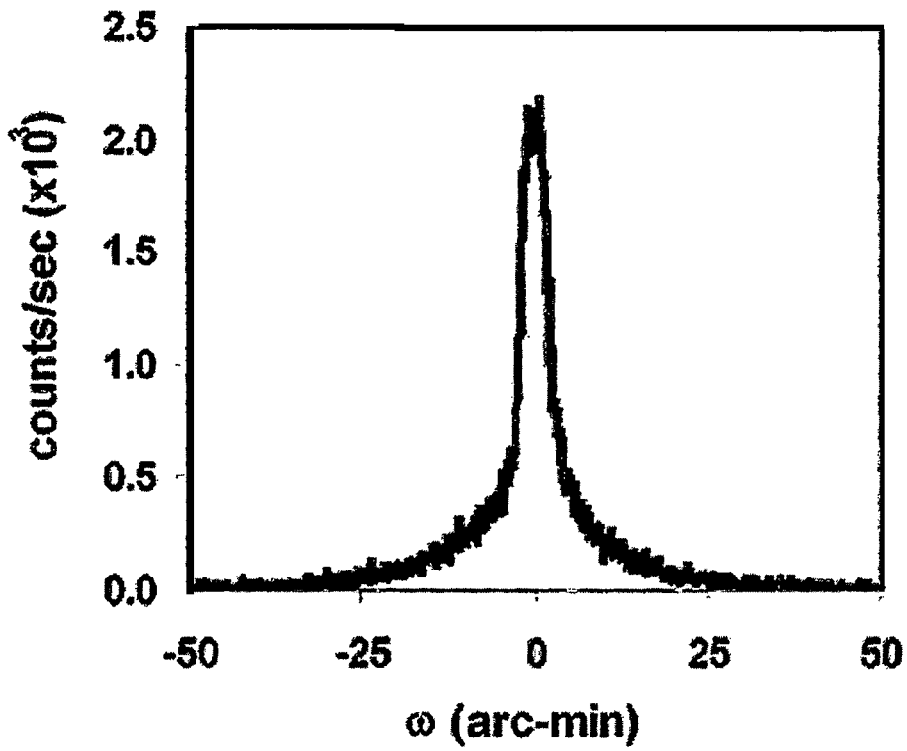
FIG. 5 shows the X-ray rocking curve of the (001) reflection of a $ZrB_2$ film grown on a Si(111) substrate according to the invention.

According to one method, an exemplary GaN layer 16 has been grown on a $ZrB_2$ buffer layer formed on a Si(111) substrate. The GaN layer is grown using plasma assisted MBE at about 650° C. Referring to FIG. 3, a GaN film of 500 nm thickness grown by plasma-assisted MBE on the $ZrB_2$ buffer layer at 650° C. is shown. The GaN film as a surface morphology with an RMS roughness of 4.4 nm. Examination of the GaN film indicates that it has good crystalline quality. Referring to FIG. 5, the X-ray rocking curve of the (001) reflection taken on the $ZrB_2$ buffer layer yields a full width at half maximum (FWHM) of 3.5 arcmin, which is very close to the FWHM reported by H. Kinoshita, S. Otani, S. Kamiyama, H. Amano, I. Akasaki, J. Suda and H. Matsunami, Jpn. J. Appl. Phys., pt. 2, 40, L1280 (2001) [5] for $ZrB_2$ bulk single crystals, which is indicative of good crystalline quality.

Figure 6:
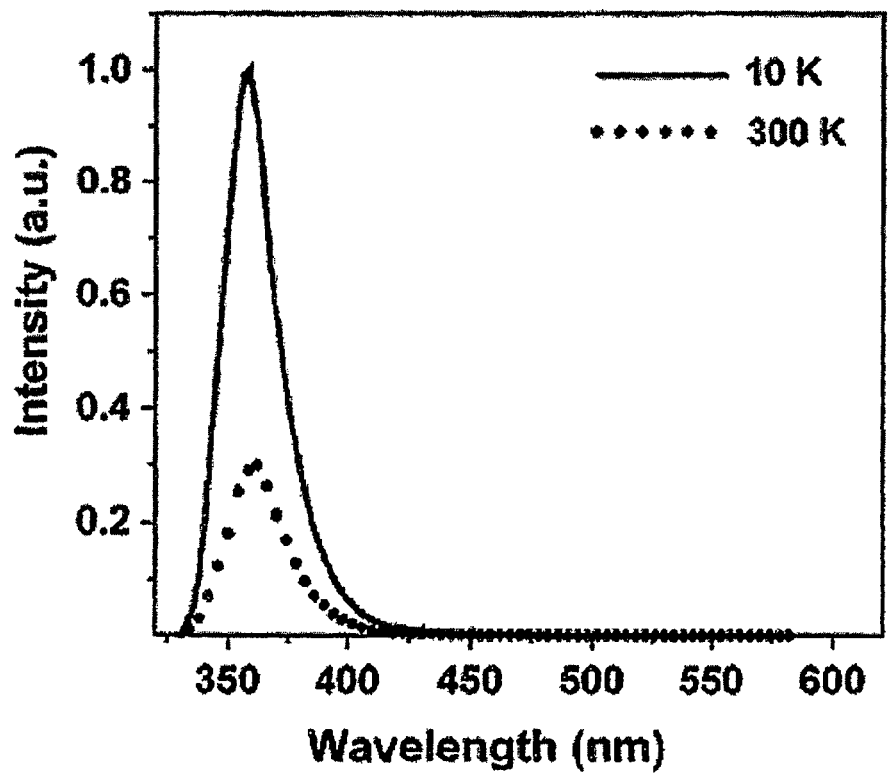
FIG. 6 shows the photoluminescence spectra, at 300K and 10K, of a GaN(0001) film grown by plasma-assisted MBE on a $ZrB_2$ buffer layer formed on a Si(111) substrate according to the present invention.

Referring to FIG. 6, the photoluminescence (PL) spectra of the MBE-grown GaN film at 300K and 10K are shown. The PL peak taken at 300K is located at 362 nm (3.43 eV). The PL peak at 10K is located at 359 nm (3.45 eV) with a FWHM of 20 nm (190 meV), close to the neutral donor bound exciton $D^0X$ line at 3.47 eV usually associated with low-temperature PL of GaN. No yellow luminescence around 560 nm was observed. The intensities of the PL peaks are comparable to those of undoped GaN films grown on sapphire by MOCVD.

Figure 4:
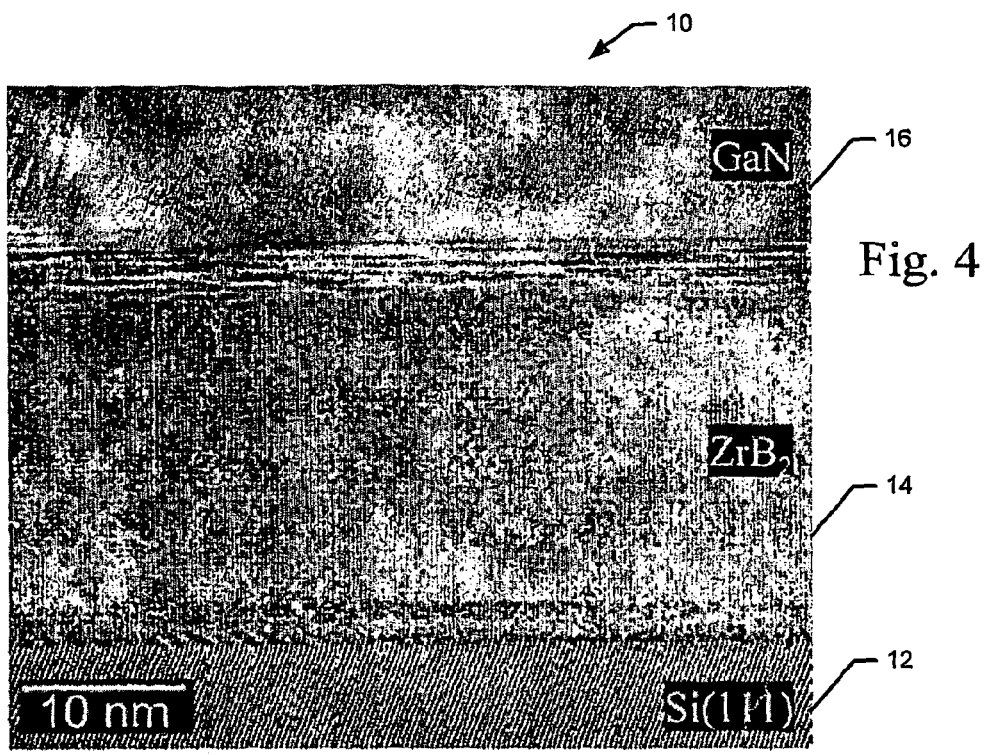
FIG. 4 is a cross-sectional transmission electron microscopy (XTEM) image showing the microstructure of a GaN/$ZrB_2$/Si(111) semiconductor structure according to the invention, taken in the [1̄10] projection referenced to the diamond cubic Si crystallographic habit.
Figure 7:
FIG. 7 is a high resolution XTEM image of a ZrB$_2$/Si(111) interface showing a "magic mismatch" of 6:5 coincidence of the ZrB$_2$ and Si(111) lattice planes at the interface.
Figure 8:
FIG. 8 is a Z-contrast XTEM image of a ZrB$_2$ layer grown on Si(111) according to the present invention, showing the sharp transition at the interface.

Referring to FIG. 4, the microstructure of the exemplary GaN/$ZrB_2$/Si(111) structure according to the invention is shown in a cross-sectional transmission electron microscopy (XTEM) image taken in the [1$\bar{1}$0] projection referenced to the diamond cubic Si crystallographic habit. FIGS. 7 and 8 are a Z-contrast XTEM images of the $ZrB_2$ buffer layer grown on the Si(111) substrate. The $ZrB_2$ film, grown on the Si substrate, is 25 nm thick and the GaN film, grown on the $ZrB_2$ film, is 500 nm thick. The epitaxial quality of both the $ZrB_2$ and GaN films is clearly demonstrated. Remarkably, near-perfect epitaxial growth of $ZrB_2$(0001) is observed in spite of the large mismatch between $d_{Si-Si}$=3.84 Å, the in-plane distance between atoms on, Si(111), and a=3.17 Å, the in-plane lattice parameter for $ZrB_2$. The growth axis is along the [0001] or [111] direction with $[11\bar{2}0]_{ZrB_2}//[\bar{1}10]_{Si}$. A close examination of the interface reveals that the misfit is taken up by a pure edge-type dislocation from the insertion of extra {1 1̄00} lattice planes along the [112̄0] direction. No threading dislocations propagating in a direction normal to the substrate are observed. The ratio of the parameters $d_{Si-Si}/a(ZrB_2)$ gives 1.21, which translates into an approximate coincidence of 6 $ZrB_2$ lattice planes with 5 Si lattice planes. Referring to FIG. 7, the high resolution XTEM image of the interface shows exactly such a 6:5 coincidence. The occurrence of such a "magic mismatch" between hexagonal $ZrB_2$ and Si(111) accounts for the epitaxial growth of $ZrB_2$ even when the lattice mismatch between the two materials is very large.

FIGS. 7 and 8 confirm the very sharp transition between $ZrB_2(0001)$ and Si(111) at the interface of the buffer layer 14 and the substrate 12. In FIGS. 7 and 8, the contrast is a function of the atomic number Z of the element under observation. The Zr atoms show a much brighter contrast than the Si atoms due to the large difference in atomic number Z. Thus the Zr atoms, with Z=40, appear considerably brighter that the Si atoms where Z=14. One can observe in FIG. 7 that the epitaxy of the $ZrB_2$ buffer layer is uninterrupted even across an atomic step on the Si(111) substrate.

Referring again to FIG. 4, it can be seen that the transition between GaN and $ZrB_2$ is also reasonably sharp. The GaN layer initially grows in a 2H-wurtzite structure, but switches over to a cubic structure, and then finally back to the 2H-wurtzite structure as the layer grows thicker (not shown in FIG. 4). The switching between wurtzite and cubic structures in the initial growth stages of GaN is well known to those of ordinary skill in the art. We do not observe the formation of an intermediate cubic phase of $Zr_xB_yN_z$ at the GaN/$ZrB_2$ interface as reported recently by R. Liu, A. Bell, F. A. Ponce, S. Kamiyama, H. Amano and I. Akasaki, Appl. Phys. Lett. 81, 3182 (2002) [8] for the growth of GaN/AlN on $ZrB_2$ single-crystal substrates. The non-occurrence of nitridation of $ZrB_2$ is probably due to the fact that our GaN films were grown by MBE at relatively low temperatures, i.e. around 650° C.

According to a presently preferred method, group III nitride material layer 16 is grown over the reflective buffer layer 14 using a MOCVD process. Because nearly all commercial products of GaN-based optoelectronic and microelectronic devices employ MOCVD as the growth method, it is desirable to employ MOCVD to grow a high optical quality undoped $Al_xGa_{1-x}N$ layer on Si(111) with a $ZrB_2(0001)$ buffer layer. However, the high MOCVD growth temperature of ≧1050° C. is generally considered incompatible with processing temperatures of Si-based devices. Moreover, Si diffuses easily at such high temperatures causing unintentional doping of the GaN layers and degrading their PL characteristics. In accordance with the invention, however, epitaxial growth of an $Al_{0.2}Ga_{0.8}N(0001)$ film by MOCVD at 1050° C. on a Si(111) substrate via a $ZrB_2(0001)$ buffer layer has been accomplished free of unintentional Si doping.

Generally, the MOCVD process involves introducing different source gases into an environment (e.g., a process system) around a substrate and providing conditions that promote a reaction between the gases to form a layer on the substrate surface. The reaction proceeds until a layer of desired thickness is achieved. The composition of the layer may be controlled, as described further below, by several factors including gas composition, gas concentration, and the reaction conditions (e.g. temperature and pressure).

EXAMPLE

Growth of AlGaN on $ZrB_2$/Si by MOCVD

The following example illustrates how the epitaxial growth of an $Al_{0.2}Ga_{0.8}N(0001)$ film by metalorganic chemical vapor deposition (MOCVD) at 1050° C. on a Si(111) substrate via a $ZrB_2(0001)$ buffer layer has been accomplished free of unintentional Si doping.

The in-plane lattice mismatch between $Al_{0.2}Ga_{0.8}N(0001)$ and $ZrB_2(0001)$ is only 0.3% and good epitaxial relation is established with $[112\bar{0}]_{AlGaN}//[112\bar{0}]_{ZrB2}//[1\bar{1}0]_{Si}$. The cathodoluminescence (CL) spectrum of the $Al_{0.2}Ga_{0.8}N$ shows a band-edge emission at 3.87 eV with full-width at half-maximum (FWHM) of 40 meV. Both the intensity and FWHM of the CL emission are comparable to those from a high-quality undoped $Al_{0.2}Ga_{0.8}N$ film grown by MOCVD on sapphire. The close lattice-match and the reflective nature of the $ZrB_2(0001)$ buffer layer are both attributes accountable for the optical quality of the $Al_{0.2}Ga_{0.8}N$ grown on Si(111).

A gas-source molecular beam epitaxy (GSMBE) process was used to grow a $ZrB_2(0001)$ reflective buffer layer on a Si(111) substrate to form a $ZrB_2(0001)$/Si(111) structure. An MOCVD process was then used to grow an $Al_xGa_{1-x}N$ layer on the $ZrB_2(0001)$/Si(111) structure.

The goal of this example was to grow $Al_xGa_{1-x}N$ layers by MOCVD with a composition of x as close to 0.26 as possible on $ZrB_2(0001)$/Si(111) substrates to achieve a perfect lattice match between the $ZrB_2$ layer and the Si(111) substrate. The in-plane lattice constant of $ZrB_2(0001)$, a=3.169 Å, has a very small 0.6% mismatch with that of GaN(0001) where a=3.189 Å. The thermal expansion coefficients along [101̄0] on the basal plane are also well-matched between $ZrB_2$ and GaN, being $5.9 \times 10^{-6}$ K$^{-1}$ and $5.6 \times 10^{-6}$ K$^{-1}$ respectively. Since a=3.112 Å for AlN(0001), then by Vegard's Law, perfect lattice match with $ZrB_2$ should be achieved with $Al_xGa_{1-x}N$, where x=0.26.

A Si(111) substrate having dimensions of about 1.5 cm by 1.5 cm and a thickness of 250 microns was positioned in an MBE chamber. A 25-nm thick buffer layer of $ZrB_2(0001)$ was grown on the Si(111) substrate by gas-source molecular beam epitaxy (GSMBE) using the unimolecular precursor zirconium tetrahydroborate, $Zr(BH_4)_4$, according to the method previously described.

After the completion of the 25-nm thick buffer layer of $ZrB_2(0001)$ on the Si(111) substrate, the sample was removed from the MBE chamber for use as a substrate for $Al_xGa_{1-x}N$ growth. MOCVD growth of $Al_xGa_{1-x}N$ was conducted in an Aixtron RF200 reactor using trimethylaluminum (TMA) and trimethylgallium (TMG) as the group III precursors and $NH_3$ gas as the nitrogen source with purified $H_2$ as a carrier gas. Before loading into the MOCVD reactor, the $ZrB_2(0001)$/Si (111) sample was degreased in acetone and methanol, followed by a rinse in deionized water. Once the $ZrB_2(0001)$/Si (111) sample was loaded into the reactor, the temperature was ramped to 800° C. with a continuous flow of $H_2$ gas for 30 minutes followed by a temperature ramp to 1050° C. to remove any contamination on the $ZrB_2$ surface. Growth of $Al_xGa_{1-x}N$ then proceeded at 1050° C. with TMA and TMG flow rates of 25 and 20 sccm, respectively, and $NH_3$ flow rate of 2000 sccm to achieve the target composition of x=0.26. Under these growth conditions, the resulting growth rate of $Al_xGa_{1-x}N$ was 1.4 µm per hour.

The microstructure, morphology, composition, and optical properties of the resulting $Al_xGa_{1-x}N$ films were characterized by X-ray diffraction (XRD), cross-sectional transmission electron microscopy (XTEM), atomic force microscopy (AFM), scanning electron microscopy (SEM), Auger electron spectroscopy (AES), secondary ion mass spectrometry (SIMS), and cathodoluminescence (CL). The XRD results were obtained using a PANalytical X'Pert MRD Pro XRD system. The lattice parameters of the $Al_xGa_{1-x}N$ film were determined to be a=3.179 Å and c=5.142 Å. Applying these a and c values to the equation given by H. Angerer, D. Brunner, F. Freudenberg, O. Ambacher, M. Stutzmann, R. Höpler, T. Metzger, E. Born, G. Dollinger, A. Bergmaier, S. Karsch and H.-J. Körner, Appl. Phys. Lett. 71, 1504 (1997). and using their Poisson ratio of v=0.36, the $Al_xGa_{1-x}N$ composition was calculated to be x=0.20, which is smaller than the target composition of x=0.26. The AES measurements conducted on the same film gave a higher value of x=0.30 using book value Auger sensitivity factors. However, because of the large uncertainty involved in the determination of composition using AES, we will refer to the composition of the film as $Al_{0.2}Ga_{0.8}N$ in the present report, based on the XRD results. The X-ray rocking curve of the (0006) reflection gives a full-width at half-maximum (FWHM of 19.6 arcmin, comparable to the FWHM of 13.9 arcmin for crack-free $Al_{0.25}Ga_{0.75}N$ grown on sapphire with an AlN intermediate layer as reported by I.-H. Lee, T. G. Kim and Y. Park, J. Cryst. Growth 234, 305 (2002).

Figure 13:
FIG. 13 is a scanning electron microscopy (SEM) image of a Al$_{0.2}$Ga$_{0.8}$N surface grown according to the invention, showing a smooth film surface.
Figure 14:
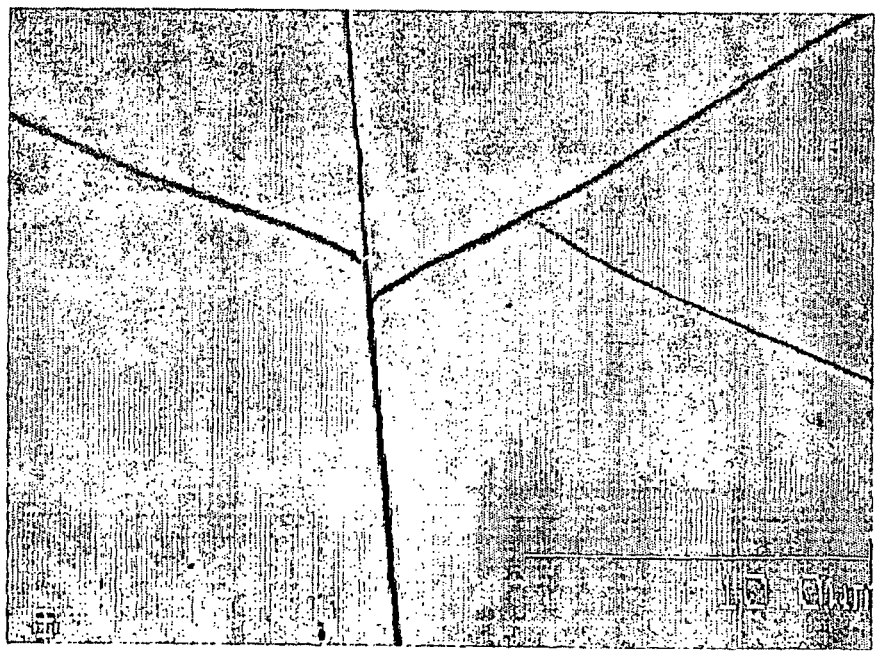
FIG. 14 is an enlarged SEM image of a portion of the film surface of FIG. 13.

FIGS. 13 and 14 show SEM images of a resulting 1.4 μm thick $Al_{0.2}Ga_{0.8}N$ film. As shown in FIG. 13, the film has a very smooth surface morphology. The RMS roughness over surface areas without cracks and pits is 0.27 nm measured by AFM. FIG. 13 shows the development of cracks in the $Al_{0.2}Ga_{0.8}N$ film. Without a nitride overlayer, a $ZrB_2(0001)$ buffer layer grown by GSMBE at 900° C. on Si(111) does not have any cracks, as can be seen in FIG. 2. To grow crack-free $Al_xGa_{1-x}N$ films on $ZrB_2/Si(111)$, therefore, one can use various approaches known to those of ordinary skill in the art. These can include, for example, using intermediate layers and/or graded-composition transition layers, as described more fully in I.-H. Lee, T. G. Kim and Y. Park, J. Cryst. Growth 234, 305 (2002) and in U.S. Pat. No. 6,617,060 issued Sep. 9, 2003 to Weeks, Jr. et al., both of which are incorporated herein by this reference.

Figure 15:
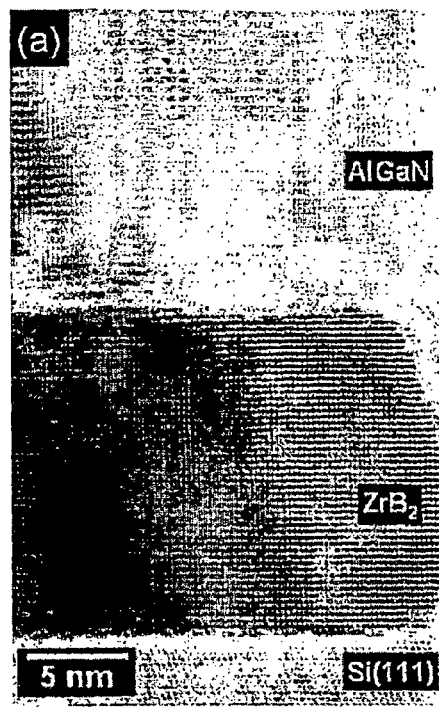
FIG. 15 is high-resolution XTEM image showing the epitaxial relationship between the Si(111) substrate, the ZrB$_2$ (0001) buffer layer, and the Al$_{0.2}$Ga$_{0.8}$N film grown by MOCVD according to the invention.
Figure 16:
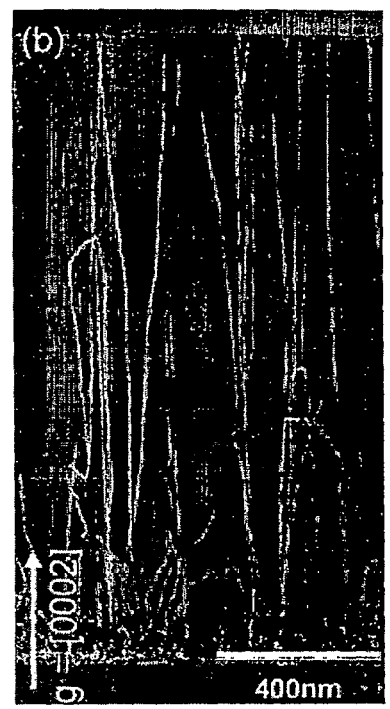
FIG. 16 is WBDF image of a Al$_{0.2}$Ga$_{0.8}$N/ZrB$_2$/Si(111) heterostructure according to the invention showing threading dislocations the Al$_{0.2}$Ga$_{0.8}$N film.

FIG. 15 is a high-resolution phase-contrast XTEM image of the exemplary $Al_{0.2}Ga_{0.8}N/ZrB_2/Si(111)$ heterostructure taken along the [1$\bar{1}$0] projection of Si. In FIG. 15, the structure of the layers and interfaces of $Al_{0.2}Ga_{0.8}N/ZrB_2/Si$ are clearly visible. The $ZrB_2(0001)$ buffer layer shows the same epitaxial quality as previously described for layers grown using the MBE process, without any evidence of degradation at the high growth temperature of 1050° C. of the MOCVD process. The transition at the interface between the $ZrB_2$ (0001) buffer layer and $Al_{0.2}Ga_{0.8}N(0001)$ layer is very sharp with minimal planar disruption of either layer. Selected-area electron diffraction patterns taken for the entire heterostructure show perfect alignment of $[11\bar{2}0]_{AlGaN}//[11\bar{2}0]_{ZrB2}//[1\bar{1}0]_{Si}$ without any rotation present in any of the three components of the heterostructure. To estimate the dislocation density within the $Al_{0.2}Ga_{0.8}N$ layer, weak-beam dark-field (WBDF) imaging was conducted. FIG. 16 shows a WBDF image of the $Al_{0.2}Ga_{0.8}N$ layer taken with g=[0002] in which dislocations with Burgers vectors c and c+a both appear. The dislocation density near the surface of the layer is $\sim 10^{10}$ cm$^2$, comparable to the dislocation density found in nitride layers grown on sapphire substrates by MOCVD.

Figure 17:
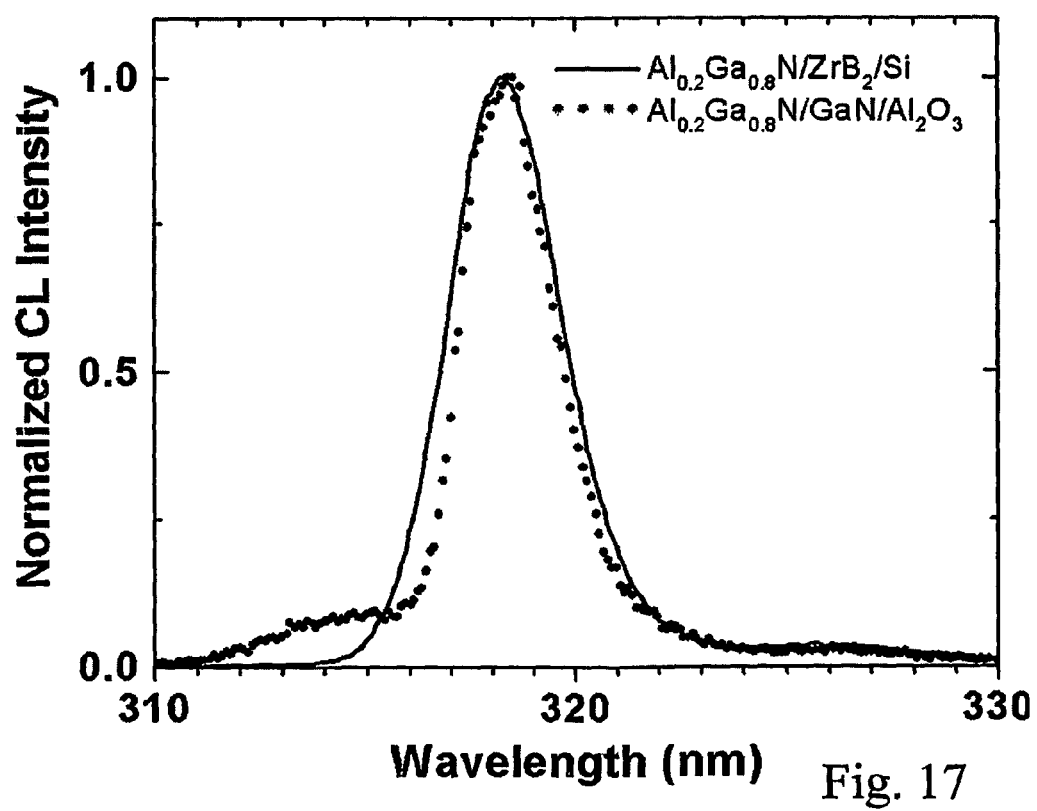
FIG. 17 shows the CL peak at 318 nm (3.87 eV) with FWHM of 3.3 nm (40 meV) of the Al$_{0.2}$Ga$_{0.8}$N film grown on ZrB$_2$/Si(111), as denoted by a continuous curve, and the CL peak of a commercial undoped film of identical composition grown on GaN/sapphire, as denoted by a dotted curve. The CL intensities of both films are normalized for comparison.

The optical properties of the exemplary $Al_{0.2}Ga_{0.8}N/ZrB_2/Si$ heterostructure were characterized by CL in a JEOL JSM 6300 scanning electron microscope operated at 5 kV with a beam current of 0.4 nA. The electron beam was scanned over an area of 120 μm×120 μm on the $Al_{0.2}Ga_{0.8}N$ surface. The measurements were conducted at a temperature of <10 K using a liquid helium cold stage. FIG. 17 shows the low-temperature CL spectrum of the $Al_{0.2}Ga_{0.8}N$ film in which an intense peak at 318 nm (3.87 eV) with a FWHM of 3.3 nm (40 meV) appears. The 3.87 eV emission corresponds closely to the band-gap value calculated for $Al_{0.2}Ga_{0.8}N$ by H. Angerer, D. Brunner, F. Freudenberg, O. Ambacher, M. Stutzmann, R. Höpler, T. Metzger, E. Born, G. Dollinger, A. Bergmaier, S. Karsch and H.-J. Körner, Appl. Phys. Lett. 71, 1504 (1997).

For comparison, FIG. 17 also shows the CL spectrum of an undoped $Al_xGa_{1-x}N$ film with identical composition of x=0.2 grown by MOCVD on sapphire by a commercial supplier. The intensities of the CL peaks are normalized for comparison. Both CL peaks occur at the identical wavelength, i.e. 318 nm, corresponding to 3.87 eV. The FWHM is narrower for the commercial sample, 36 meV versus 40 meV. However, the commercial $Al_{0.2}Ga_{0.8}N$ film shows a small shoulder below 316 nm, suggesting that it may contain phases of $Al_xGa_{1-x}N$ where x>0.2. Neither sample exhibits yellow luminescence. The CL peak intensity of the exemplary $Al_xGa_{1-x}N$ film grown on silicon is three times higher than that of the commercial sample, with an actual count rate of over 20,000 counts/s. One possible reason for higher intensity could be the presence of unintentional doping of Si in the exemplary film. However, AES analysis of the exemplary film showed no Si contamination at the surface. Depth profiling analysis by high mass-resolution SIMS showed that the Si-28 signal was at background noise level of 0.03 counts/s when the Al-27 count rate was 150,000 counts/s, yielding an upper limit of Si concentration of $10^{14}$ cm$^{-3}$, which suggests that the exemplary $Al_{0.2}Ga_{0.8}N$ film is essentially undoped. Moreover, doping by Si generally leads to the broadening of the FWHM of the CL peak. I.-H. Lee, T. G. Kim and Y. Park, J. Cryst. Growth 234, 305 (2002) have reported that the CL peak of an $Al_{0.38}Ga_{0.62}N$ film is broadened 1.5 times when it is doped by Si at a level of $\sim 10^{18}$ cm$^{-3}$. Another possibility for higher CL intensity in our film could be the fact that the thickness of the exemplary film is 1.4 μm whereas the commercial film thickness is only 90 nm. However, the choice of low excitation voltage for CL, i.e. 5 kV, should ensure that the excitation volume of the electron beam is confined entirely within either film. The 90 nm thick commercial $Al_{0.2}Ga_{0.8}N$ film was grown on a 4 μm thick GaN layer on sapphire, and a very small GaN CL peak at 356 nm was observed in the spectrum. However, this GaN CL peak was still present when the beam voltage was reduced to 1.5 kV, which suggests that the GaN peak at 356 nm is probably excited by the energetic 318 nm emission from the $Al_{0.2}Ga_{0.8}N$ layer and not directly by the electron beam. This means that the intense CL observed in the exemplary film grown on silicon is largely accountable by the reflecting nature of the $ZrB_2$ buffer layer on the Si(111) substrate.

The foregoing example demonstrates the effectiveness of the $ZrB_2(0001)$ buffer layer for the MOCVD growth of $Al_xGa_{1-x}N$ on Si(111) substrates. No unintentional Si doping occurs in the $Al_{0.2}Ga_{0.8}N$ film even at the MOCVD growth temperature of 1050° C. The intensity and FWHM of the CL peak corresponding to band-edge emission of 3.87 eV are comparable to those from a high-quality undoped $Al_{0.2}Ga_{0.8}N$ commercial sample grown on sapphire.

Integration of Wide Bandgap Nitride Semiconductors with Si

According on one important aspect of the invention, wide bandgap nitride semiconductor materials can be integrated with Si to form semiconductor structures and active electronic devices. These semiconductor structures can be used to fabricate active microelectronic devices, such as transistors including field effect transistors and bipolar transistors. The semiconductor structures also can be used to fabricate optoelectronic devices, such as laser diodes and light emitting diodes. The reflective nature of the buffer layer 14 presents an added bonus to optoelectronic applications of the group III nitrides. As previously discussed, silicon is ~45% absorbing for UV or near-UV light. With the use of the buffer layer as a template, however, the silicon substrate becomes 100% reflecting, thus avoiding any loss of emission intensity from the group III nitrides.

In one embodiment, a semiconductor structure according to the invention includes: a substrate; a $ZrB_2$ region formed over the substrate, and an active region formed over the $ZrB_2$ region. The substrate can comprise silicon, silicon carbide (SiC), gallium arsenide (GaAs) or sapphire. The active region can be formed of a group III nitride material region, such as GaN, AlN, InN, AlGaN, InGaN or AlInGaN, or a quaternary nitride, such as SiCAlN. The active region can be formed by known fabrication processes, including MOCVD or by atomic layer epitaxy.

For embodiments having an active region of SiCAlN, a method of growing epitaxial thin film SiCAlN on silicon and silicon carbide substrates at temperatures in the range of 550-750° C. is described in U.S. patent application Ser. No. 09/965,022, filed Sep. 26, 2001 and entitled "Low Temperature Epitaxial Growth of Quaternary Wide Bandgap Semiconductors" which is incorporated herein by this reference. A method for growing high purity, low defect, device-quality SiCAlN epitaxial films on silicon and silicon carbide substrates by means of gas source molecular beam epitaxy (GSMBE) is fully described in U.S. patent application filed Oct. 16, 2001, entitled "Low Temperature Epitaxial Growth of Quaternary Wide Bandgap Semiconductors," which is incorporated herein by this reference. The growth of SiCAlN epitaxial film on a Si(111) substrate with a Si—Al—O—N interface layer is described fully in U.S. Provisional Patent Application, Ser. No. 60/380,998, filed May 16, 2002 and entitled "Growth of SiCAlN on Si(111) via a Crystalline Oxide Interface" which is incorporated herein by this reference.

FIGS. 9-12, which will now be discussed, show illustrative examples of semiconductor devices having a $ZrB_2$ buffer layer. The $ZrB_2$ buffer layer provides a fully reflecting buffer layer that has a small lattice mismatch with GaN. The GaN films epitaxially grown on the $ZrB_2$ buffer layer on Si(111) exhibit PL intensities comparable to MOCVD grown GaN films. Thus, efficient light-emitting optoelectronic devices based on group III nitrides can be produced.

Example 1

Field Effect Transistors

Figure 9:
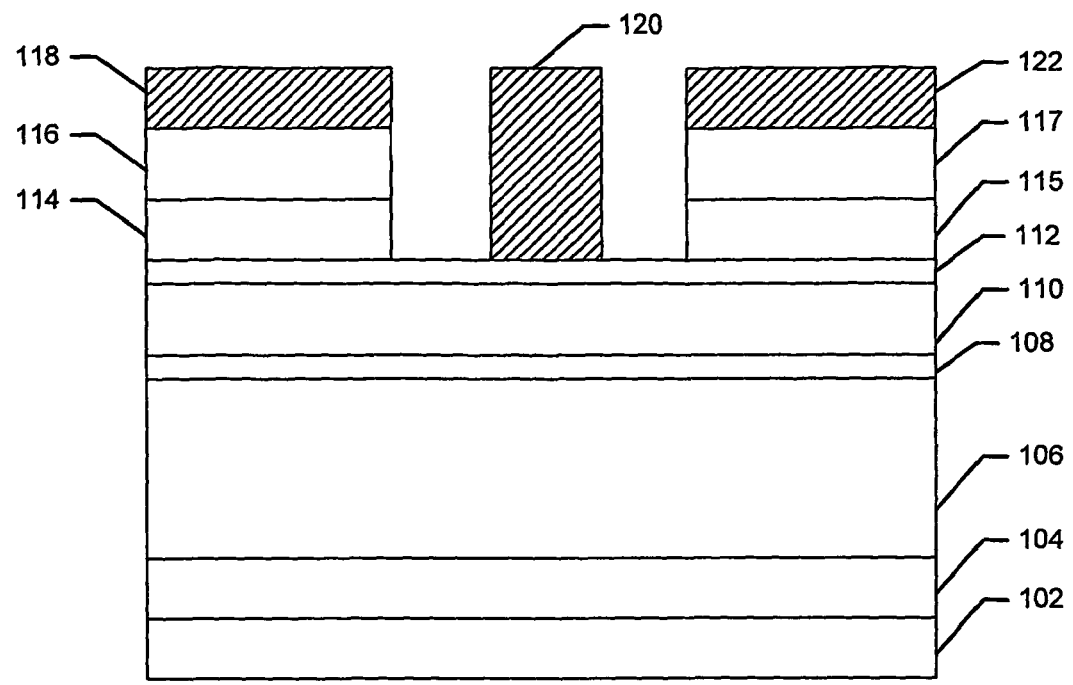
FIG. 9 shows an exemplary embodiment of an AlGaN/GaN heterostructure field effect transistor in accordance with the present invention.

FIG. 9 schematically shows an example of an AlGaN/GaN heterostructure field effect transistor (HFET) 100 formed from semiconductor material in accordance with the present invention. As shown in FIG. 9, the HFET 100 includes a Si(111) substrate 102 with a $ZrB_2$ buffer layer 104 grown on the substrate 102 using the process described above for growing epitaxial thin film $ZrB_2$ on silicon. In the illustrative example, the following layers are then formed over the buffer layer 104: an n-type GaN layer 106; an undoped $Al_{0.25}Ga_{0.75}N$ spacer layer 108; an n-type $Al_{0.25}Ga_{0.75}N$ barrier layers 110; an undoped $Al_{0.25}Ga_{0.75}N$ contact layer 112; p-type $Al_{0.25}Ga_{0.75}N$ cap layers 114, 115; and p-type GaN cap layers 116, 117. Ohmic contacts 118, 122 are formed on the surface of each of the cap layers 116, 117, respectively, using Ti/Al/Ti/Au metal to form source and gate contacts. An ohmic contact 120 is formed on the surface of the undoped layer 112 using Ni/Au metal to form a gate contact.

N. Maeda, T. Saitoh, K. Tusubaki and N. Kobayashi, in their article entitled "AlGaN/GaN Heterostructure Field-Effect Transistors with High Al Compositions Fabricated with Selective-Area Regrowth," Phys. Stat. Sol. (a) 188, No. 1, pp. 223-226 (2001), which is incorporated herein by this reference, describe in further detail a process for fabricating the layers 106, 108, 110, 112, 114, 115, 116 and 117 and the ohmic contacts 118, 120, 122 to form the HFET 100. The structure is grown by metal organic vapor phase epitaxy (MOVPE). In the illustrative example of FIG. 9, the $ZrB_2$ buffer layer 104 has a thickness of about 100 nm. The n-type GaN layer 106 has a thickness of about 1 μm. The spacer layer 108 has a thickness of about 3 nm. The barrier layer 110 has a thickness of about 8 nm. The contact layer 112 has a thickness of about 4 nm. The $Al_{0.25}GA_{0.75}N$ cap layers 114, 115 have a thickness of about 10 nm. The GaN cap layers 116, 117 have a thickness of about 15 nm. It should be understood that HFET may have a variety of different structures known to those of ordinary skill in the art.

Example 2

Double Heterojunction Bipolar Transistor

Figure 10:
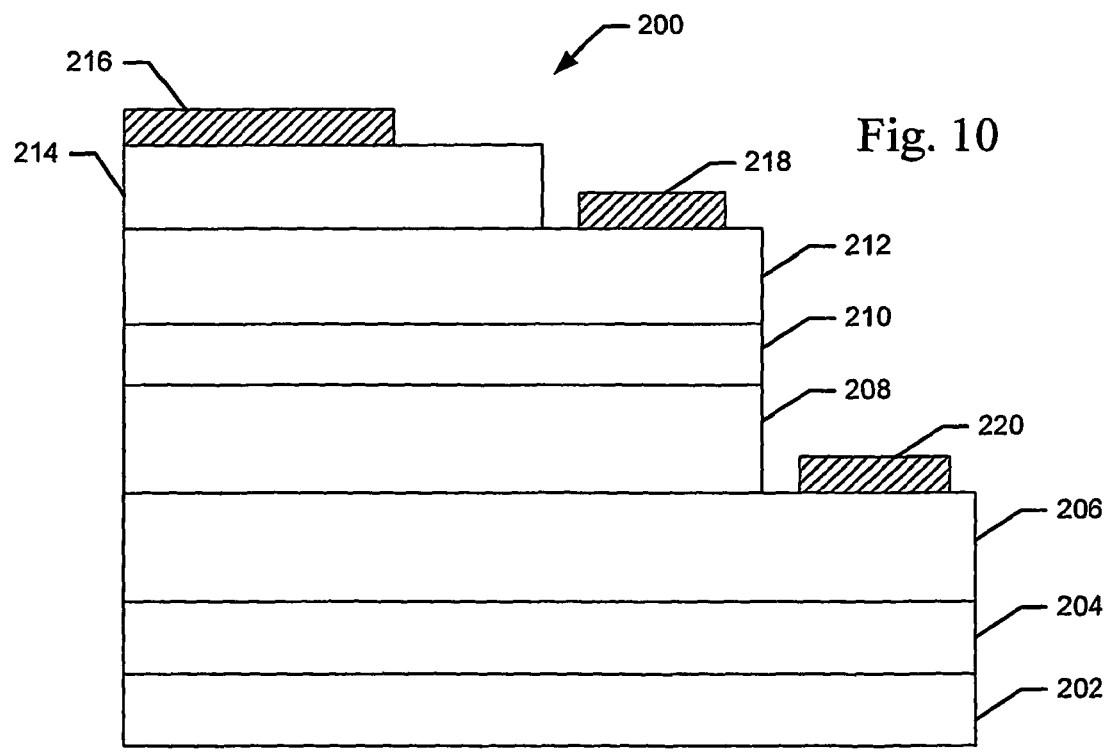
FIG. 10 shows an exemplary embodiment of an InGaN/GaN heterojunction bipolar transistor in accordance with the present invention.

FIG. 10 shows an example of an Npn InGaN/GaN double heterojunction bipolar transistor, (DHBT) 200 having a $ZrB_2$ buffer layer 204 formed on a Si(111) substrate 202, in accordance with the present invention. The DHBT 200 includes an n-type Si(111) substrate 202 with a 100 nm $ZrB_2$ buffer layer 204 deposited on the substrate 202 using the process described above for growing epitaxial thin film $ZrB_2$ on silicon. The following layers can be grown over the buffer layer 204 by low-pressure metalorganic vapor phase epitaxy and can be defined by electron cyclotron resonance plasma etching: an n-type GaN sub-collector layer 206; an n-type GaN collector layer 208; a graded InGaN layer 210; a p-type InGaN base layer 212; and an n-type GaN emitter layer 214. An n-type ohmic contact 216 is formed on the surface of the n-type emitter layer 214 using Al/Au metal. A p-type ohmic contact 218 is formed on the surface of the p-type emitter layer 218 using Pd/Au metal. An n-type ohmic contact 220 is formed on the surface of the n-type sub-collector layer 206 using Al/Au metal.

T. Malcinoto, K. Kumakura and N. Kobayashi, in "High Current Gains Obtained by InGaN/GaN Double Heterojunction Bipolar Transistors", Phys. Stat. Sol. (a) 188, No. 1, pp. 183-186 (2001), which is incorporated herein by this reference, describe in further detail the structure and fabrication of the layers 206, 208, 210, 212 and 214 to form an InGaN/GaN double heterojunction bipolar transistor. In this illustrative ex-ample, the n-GaN sub-collector layer 206 has a thickness of 1 μm and a Si doping concentration of $3 \times 10^{18}$ $cm^{-3}$. The n-GaN collector layer 208 has a thickness of 500 nm and a Si doping concentration of $5 \times 10^{18}$ $cm^{-3}$. The graded InGaN layer 210 has a thickness of 30 nm and a Si doping concentration of $2 \times 10^{17}$ $cm^{-3}$. The p-InGaN base layer 212 has a thickness of 100 nm and an In mole fraction of 0.06. The Mg doping concentration in the base layer 212 is $1 \times 10^{19}$ $cm^{-3}$, corresponding to a hole concentration of $5\times10^{18}$ cm$^{-3}$ at room temperature. The n-GaN emitter layer 214 has a thickness of 50 nm and a Si doping concentration of $4\times10^{19}$ cm$^{-3}$. It should be understood that the DHBT may have a variety of different structures known to those of ordinary skill in the art.

Example 3

Laser Diodes

Figure 11:
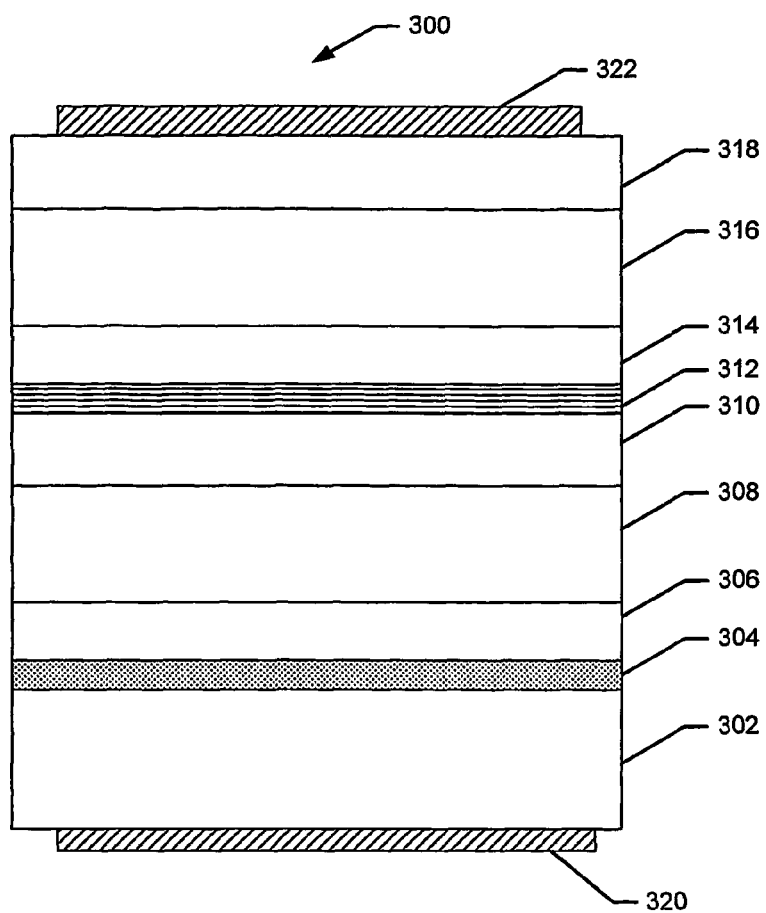
FIG. 11 shows an exemplary structure of a multiple quantum well laser diode laser having a ZrB$_2$ buffer layer formed on a Si(111) substrate in accordance with the present invention.

FIG. 11 shows an exemplary structure of a MQW laser diode having a ZrB$_2$ buffer layer 304 formed on a Si(111) substrate 302 in accordance with the present invention. As shown in FIG. 11, the structure 300 has an n-type Si(111) substrate 302 with an ZrB$_2$ buffer layer 304 deposited on the substrate 302. The buffer layer 304 can be grown on the substrate 302 using the process previously described for growing epitaxial thin film ZrB$_2$ on silicon. The following layers are formed over the buffer layer 304: a Si-doped n-type GaN layer 306; a Si-doped Al$_{0.13}$Ga$_{0.87}$N cladding layer 308; an Al$_{0.06}$Ga$_{0.94}$N waveguide layer 310; a multi-layer quantum well active layer 312; an Al$_{0.06}$Ga$_{0.94}$N waveguide layer 314; a Mg-doped Al$_{0.13}$Ga$_{0.87}$N cladding layer 316; and a Mg-doped p-type GaN contact layer 318. An n-type electrode 320 is formed on the rear surface of the substrate 302, and a p-type electrode 322 is formed on a surface of the contact layer 318. It should be understood that the MQW laser diode may have a variety of different structures known to those of ordinary skill in the art.

F. Nakamura, T. Kobayashi, T. Asatsuma, K. Funato, K. Yanashima, S. Hashimoto, K. Naganuma, S. Tomioka, T. Miyajima, E. Morita, H. Kawai and M. Ikeda, in their article entitled "Room-temperature pulsed operation of a GaInN multiple-quantum-well laser diode with optimized well number," Journal of Crystal Growth 189/190, pp. 841-845 (1998), which is incorporated herein by this reference, describe details of the structure and fabrication of a GaInN multiple quantum well (MQW) laser diode having such layers deposited on a buffer layer. A. Kuramata, K. Domen R. Soejima, K. Horino, S. Kubota and T. Tanahashi, in an article entitled "InGaN laser diode grown on 6H—SiC substrate using low pressure metalorganic vapor phase epitaxy," Journal of Crystal Growth 189/190 pp. 826-830 (1998), which is incorporated herein by this reference, also describe details of the structure and fabrication of a GaInN MQW laser diode having such layers deposited on a buffer layer 304.

Also, J. Han, K. E. Waldrip, J. J. Figiel, S. R. Lee and A. J. Fischer, in their article entitled "Optically-pumped UV Lasing from a GaN-based VCSEL," which is incorporated herein by this reference, describe the structure and fabrication of a vertical-cavity surface-emitting laser (VCSEL) structure with GaN/AlGaN distributed Bragg reflectors (DBRs) grown on a sapphire substrate. Using the techniques described by Han, et al., VCSELs with GaN/AlGaN DBRs can be grown on a ZrB$_2$ buffer layer formed on a Si(111) substrate according to the process described above.

Example 4

LEDs

Figure 12:
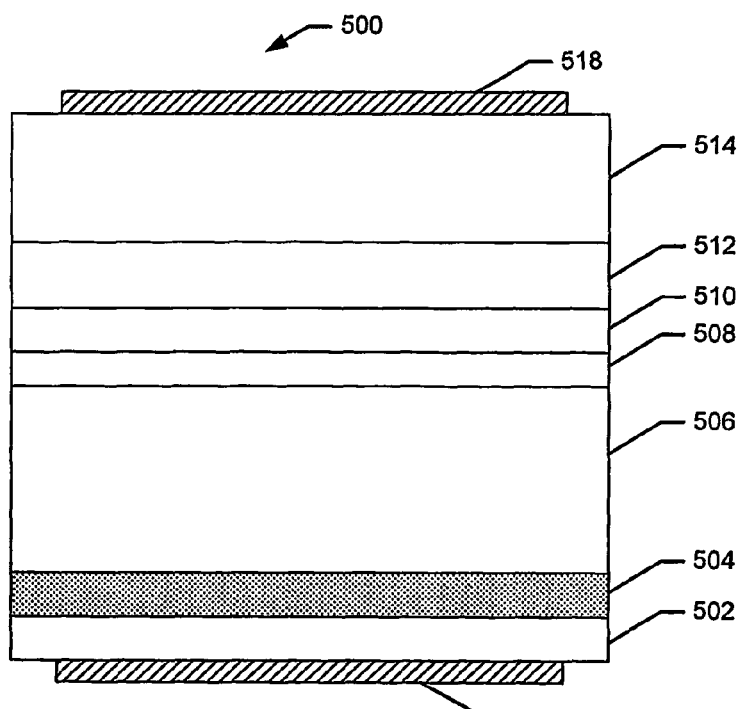
FIG. 12 shows an exemplary structure of a UV LED having a ZrB$_2$ buffer layer formed on a Si(111) substrate in accordance with the present invention.

FIG. 12 shows an example of a UV LED structure 500 having a ZrB$_2$ buffer layer 504 formed on a Si(111) substrate 502 in accordance with the present invention. As shown in FIG. 12, the LED structure 500 has an n-type Si(111) substrate 502 with an n-type ZrB$_2$ buffer layer 504 deposited on the substrate 502, which can be grown according to the processes described above. In this illustrative example, the following layers are formed over the buffer layer 504: a 2 μm thick n-type GaN layer 506; a 30 nm thick n-type Al$_{0.16}$Ga$_{0.9}$N cladding layer 508; a 40 nm thick undoped InGaN active layer 510; a 60 nm thick p-type Al$_{0.15}$Ga$_{0.85}$N cladding layer 512; a 120 nm thick p-type GaN layer 514. An n-type electrode 516 is formed on an exposed surface of the n-type Si(111) substrate 502, and a p-type electrode 518 is formed on a surface of the p-type GaN layer 514. T. Mukai, D. Morita and S. Nakamura, in their article entitled "High-power UV InGaN/AlGaN double-heterostructure LEDs," Journal of Crystal Growth 189/190 pp. 778-781 (1998), which is incorporated herein by this reference, describe details of the structure and fabrication of the layers of a InGaN/AlGaN (LEDs) having GaN buffers deposited on sapphire substrates. Using the known techniques described by Mukai, et al., LEDs having GaN alloy active layers also can be grown on ZrB$_2$/Si (111) substrates as shown in FIG. 12, which substrates are grown in accordance with the processes described herein. It should be understood that LEDs may have a variety of different structures known to those of ordinary skill in the art.

From the foregoing, it can be seen that under appropriate kinetic conditions, ZrB$_2$(0001) can be grown epitaxially on Si(111) despite large lattice mismatch. The ZrB$_2$ layer serves as a reflective and conductive template for the growth of GaN, which is nearly lattice matched with ZrB$_2$. The ZrB$_2$/Si(111) substrate offers many distinct advantages in both microelectronic and optoelectronic applications of group III nitrides, the most important of which is the integration with silicon electronics.

The above-described invention possesses numerous advantages as described herein and in the referenced appendices. The invention in its broader aspects is not limited to the specific details, representative devices, and illustrative examples shown and described. Accordingly, departures may be made from such details without departing from the spirit or scope of the general inventive concept.

What is claimed is:

1. A method for depositing an epitaxial ZrB$_2$ layer on a substrate in a gas source molecular beam epitaxial chamber, the method comprising introducing into the chamber a gaseous precursor (Zr(BH$_4$)$_4$ under conditions whereby epitaxial ZrB$_2$ is formed on the substrate.

2. The method of claim 1 wherein the gaseous precursor is introduced at a temperature between about 875° C. and about 925° C.

3. The method of claim 2 wherein the gaseous precursor is introduced at a temperature of about 900° C.

4. The method of claim 1 wherein the substrate comprises silicon.

5. The method of claim 4 wherein the silicon comprises Si(111).

6. The method of claim 4 wherein the silicon comprises Si(100).

7. The method of claim 1 wherein the substrate comprises silicon carbide.

8. The method of claim 1 wherein the substrate comprises sapphire.

9. The method of claim 1 wherein the epitaxial ZrB$_2$ is formed on the substrate at a growth rate of about 1.2 nm per minute.

10. A method for depositing an epitaxial reflective layer having the formula XB$_2$ on a substrate in a gas source molecular beam epitaxial chamber, wherein X is an element selected from the group consisting of Zr, Hf and Al, the method comprising introducing into the chamber a gaseous precursor including X under conditions whereby epitaxial $XB_2$ is formed on the substrate.

11. The method of claim 10 wherein the gaseous precursor is introduced at a temperature between about 875° C. and about 925° C.

12. The method of claim 11 wherein the gaseous precursor is introduced at a temperature of about 900° C.

13. The method of claim 10 wherein the substrate comprises silicon.

14. The method of claim 13 wherein the silicon comprises Si(111).

15. The method of claim 13 wherein the silicon comprises Si(100).

16. The method of claim 10 wherein the substrate comprises silicon carbide.

17. The method of claim 10 wherein the substrate comprises sapphire.

18. The method of claim 10 wherein the substrate comprises $Al_2O_3$.

19. A method for depositing an epitaxial $ZrB_2$ layer on a substrate in a chemical vapor deposition chamber, the method comprising introducing into the chamber a gaseous precursor $Zr(BH_4)_4$ and a diluting agent under conditions whereby epitaxial $ZrB_2$ is formed on the substrate.

20. The method of claim 19 wherein the diluting agent comprises hydrogen.

21. The method of claim 19 wherein the diluting agent comprises an inert gas.

22. The method of claim 19 wherein the inert gas comprises helium, argon or nitrogen.

23. A semiconductor structure comprising a substrate and a single crystal reflective and conductive film formed by epitaxy over the substrate, wherein the reflective and conductive layer comprises B and an element selected from the group consisting of Zr, Hf, and Al.

24. The semiconductor structure of claim 23 wherein the substrate comprises a material selected from the group consisting of Si, $Al_2O_3$, SiC and GaAs.

25. The semiconductor structure of claim 24 wherein the reflective and conductive layer comprises $ZrB_2$.

26. The semiconductor structure of claim 24 wherein the reflective and conductive layer comprises $AlB_2$.

27. The semiconductor structure of claim 24 wherein the reflective and conductive layer comprises $HfB_2$.

28. The semiconductor structure of claim 24 wherein the substrate comprises Si(111).

29. The semiconductor structure of claim 24 wherein the substrate comprises Si(100).

30. A semiconductor structure comprising: a substrate, $ZrB_2$ region formed over the substrate, and an active region formed over the $ZrB_2$ region, wherein the active region is substantially lattice-matched with the $ZrB_2$ region.

31. The semiconductor structure of claim 30, wherein the active region comprises a compound selected from the group consisting of GaN, AlGaN, InGaN, AlInGaN, AN, InN and SiCAlN.

32. The semiconductor structure of claim 30, wherein the substrate comprises a silicon substrate.

33. The semiconductor structure of claim 30, wherein the substrate comprises a silicon carbide substrate.

34. The semiconductor structure of claim 30, wherein the substrate comprises a sapphire substrate.

35. The semiconductor structure of claim 30 wherein the $ZrB_2$ region is formed by molecular beam epitaxy.

36. The semiconductor structure of claim 30 wherein the $ZrB_2$ region is formed by chemical vapor deposition.

37. The semiconductor structure of claim 30 wherein the structure is operable as a microelectronic device.

38. The semiconductor structure of claim 30 wherein the structure is operable as an optoelectronic device.

39. A semiconductor structure comprising a substrate and an epitaxial reflective and conductive film formed over the substrate and an active layer lattice-matched to the reflective and conductive film, wherein the reflective and conductive film comprises B and an element selected from the group consisting of Zr, Hf, and Al.

40. The semiconductor structure of claim 39 wherein the substrate comprises a material selected from the group consisting of Si, $Al_2O_3$, SiC and GaAs.

41. The semiconductor structure of claim 39 wherein the reflective and conductive film comprises $ZrB_2$.

42. The semiconductor structure of claim 39 wherein the reflective and conductive film comprises $AlB_2$.

43. The semiconductor structure of claim 39 wherein the reflective and conductive film comprises $HfB_2$.

44. The semiconductor structure of claim 39 wherein the substrate comprises Si(111).

45. The semiconductor structure of claim 39 wherein the substrate comprises Si(100).

* * * * *